US009835689B2

(12) United States Patent
Osanai et al.

(10) Patent No.: US 9,835,689 B2
(45) Date of Patent: Dec. 5, 2017

(54) SEMICONDUCTOR DEVICE AND CONTROL FOR TESTING A TRANSISTOR AND DIODE

(71) Applicant: TOYOTA JIDOSHA KABUSHIKI KAISHA, Toyota-shi, Aichi-ken (JP)

(72) Inventors: Yosuke Osanai, Toyota (JP); Ayuki Koishi, Kani (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 332 days.

(21) Appl. No.: 14/643,518

(22) Filed: Mar. 10, 2015

(65) Prior Publication Data

US 2015/0260780 A1 Sep. 17, 2015

(30) Foreign Application Priority Data

Mar. 12, 2014 (JP) ................................ 2014-049497

(51) Int. Cl.

*G01R 31/02* (2006.01)
*G01R 31/40* (2014.01)
*H02M 1/08* (2006.01)
*H02M 7/538* (2007.01)
*H02M 1/00* (2006.01)

(52) U.S. Cl.

CPC .............. *G01R 31/40* (2013.01); *H02M 1/08* (2013.01); *H02M 7/538* (2013.01); *H02M 2001/0009* (2013.01); *H02M 2001/0012* (2013.01); *H02M 2001/0048* (2013.01); *Y02B 70/1491* (2013.01)

(58) Field of Classification Search

CPC .............. G01R 31/26; G01R 31/2642; G01R 31/2648; G01R 31/2831; G01R 31/31702; G01R 31/318511; H01L 22/00

See application file for complete search history.

(56) References Cited

U.S. PATENT DOCUMENTS 7,414,867 B2 * 8/2008 Hussein .............. H01L 27/0255 361/101
8,878,572 B2 * 11/2014 Akiyama ............... H03K 5/153 327/108
9,461,638 B2 * 10/2016 Miyauchi ............... H03K 17/56

(Continued)

FOREIGN PATENT DOCUMENTS

CN 101540543 A 9/2009
JP 2008-072848 A 3/2008

(Continued)

*Primary Examiner* — Tung X Nguyen
*Assistant Examiner* — Dominic Hawkins
(74) *Attorney, Agent, or Firm* — Oliff PLC

(57) ABSTRACT

A semiconductor device includes a transistor, a diode, a first detection circuit, a second detection circuit, a calculation circuit, and a determination circuit. The diode is connected in reverse parallel with the transistor. The first detection circuit is configured to detect a change rate of a gate voltage of the transistor with respect to time. The second detection circuit is configured to detect a gate current of the transistor. The calculation circuit is configured to calculate a gate capacitance based on the change rate of the gate voltage with respect to time, and the gate current. The determination circuit is configured to determine, based on a determination result of the gate capacitance when a charge is injected to a gate of the transistor, whether a current flows to the diode or to the transistor.

7 Claims, 8 Drawing Sheets

100 160 VH 170 111 112 110 VgeH 141a 155 154 152 151 130 153 156 157 121 122 120 140 141b VgeL 158 150 GND

(56) References Cited

U.S. PATENT DOCUMENTS

| | | | | |
|---|---|---|---|---|
| 2001/0038518 | A1* | 11/2001 | Yamaji ............... | H03K 17/0822 361/93.8 |
| 2003/0193051 | A1* | 10/2003 | Beech ............... | G01R 31/2884 257/48 |
| 2004/0130923 | A1* | 7/2004 | Yin Ho ............... | H02M 1/44 363/131 |
| 2007/0008679 | A1* | 1/2007 | Takahasi ............... | H01L 24/49 361/600 |
| 2007/0152699 | A1* | 7/2007 | Jang ............... | G01R 31/2648 324/750.26 |
| 2007/0210072 | A1* | 9/2007 | Yabe ............... | H01L 27/0248 219/505 |
| 2008/0012041 | A1 | 1/2008 | Kesler | |
| 2008/0122497 | A1* | 5/2008 | Ishikawa ............... | H03K 17/168 327/108 |
| 2010/0019808 | A1* | 1/2010 | Fuma ............... | H02M 1/08 327/109 |
| 2011/0285378 | A1* | 11/2011 | Tamaoka ............... | H02M 1/38 323/351 |
| 2012/0025794 | A1* | 2/2012 | Inoue ............... | H02M 3/158 323/271 |
| 2012/0194076 | A1* | 8/2012 | Murata ............... | H05B 33/0884 315/119 |
| 2012/0293218 | A1* | 11/2012 | Dewa ............... | H03K 17/063 327/109 |

FOREIGN PATENT DOCUMENTS

| | | | |
|---|---|---|---|
| JP | 2009-254033 | A | 10/2009 |
| JP | 2009-254034 | A | 10/2009 |
| JP | 2010-004728 | A | 1/2010 |
| JP | 2012-019550 | A | 1/2012 |

* cited by examiner 100
170
VH
110
111
112
130
120
121
122
GND
160
VgeH
150
151
VgeL
152
153
154
155
156
157
158
140
141a
141b

SEMICONDUCTOR DEVICE AND CONTROL FOR TESTING A TRANSISTOR AND DIODE

INCORPORATION BY REFERENCE

The disclosure of Japanese Patent Application No. 2014-049497 filed on Mar. 12, 2014 including the specification, drawings and abstract is incorporated herein by reference in its entirety.

BACKGROUND OF THE INVENTION

1. Field of the Invention

The present invention relates to a semiconductor device and a control method of the same.

2. Description of Related Art

A reverse conducting insulated gate bipolar transistor (RC-IGBT) module is known in a power electronics technology that controls drive of a motor mounted on a hybrid vehicle (HV) or an electric vehicle (EV). The RC-IGBT may be regarded as a diode-built-in IGBT.

For example, Japanese Patent Application Publication No. 2010-4728 (JP 2010-4728 A) discloses a power converter in which a diode sense element disposed to a freewheeling diode (FWD) unit and an IGBT sense element disposed to an IGBT unit are connected to one end of a sense resistor, and a control circuit detects an abnormality by determining a polarity of a current that flows to the resistor.

According to the technology of JP 2010-4728 A, a large potential difference generated between a collector and an emitter is directly measured. Therefore, a device having a high withstand voltage is necessary.

SUMMARY OF THE INVENTION

The present invention provides a semiconductor device and a control method of the same.

A semiconductor device according to a first aspect of the present invention includes a transistor, a diode, a first detection circuit, a second detection circuit, a calculation circuit and a determination circuit. The diode is connected in reverse parallel with the transistor. The first detection circuit is configured to detect a change rate of a gate voltage of the transistor with respect to time. The second detection circuit is configured to detect a gate current of the transistor. The calculation circuit is configured to calculate a gate capacitance based on the change rate of the gate voltage with respect to time, and the gate current. The determination circuit is configured to determine, based on a determination result of the gate capacitance at a time when a charge is injected to a gate of the transistor, whether a current flows to the diode or to the transistor.

A control method of a semiconductor device according to a second embodiment of the present invention is a control method of a semiconductor device that includes a transistor and a diode connected in inverse parallel with the transistor. The control method includes: detecting a change rate of a gate voltage of the transistor with respect to time; detecting a gate current of the transistor; calculating a gate capacitance based on the change rate of the gate voltage with respect to time, and the gate current; and determining, based on a determination result of the gate capacitance when a charge is injected to a gate of the transistor, whether a current flows to the diode or to the transistor.

According to the aspects described above, a polarity of the current can be determined without using a device having a high withstand voltage.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
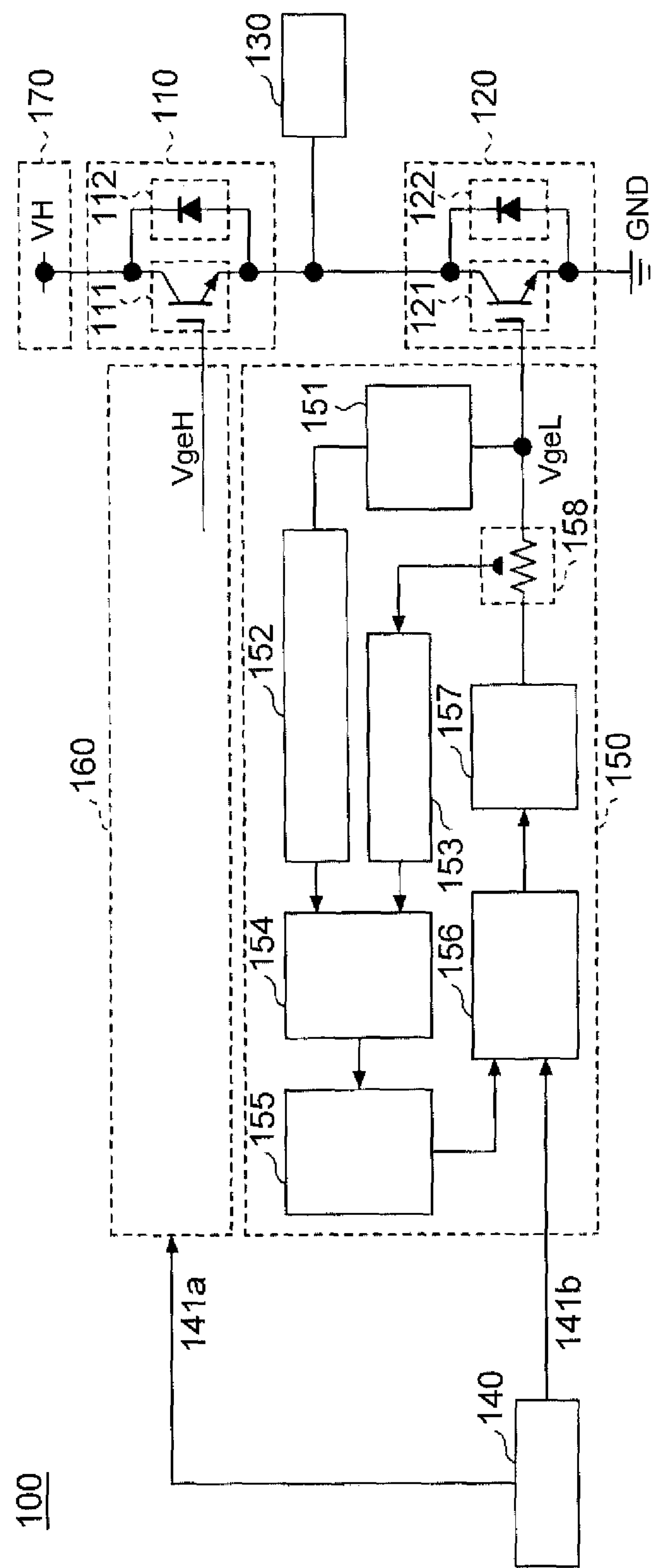
FIG. 1 is a diagram that illustrates a constitution of a semiconductor device according to a first embodiment of the present invention.

Hereinafter, an embodiment for carrying out the invention will be described with reference to the drawings. In the respective drawings, the same constituents will be identified by the same reference numerals and duplicated descriptions thereof will be omitted in some cases.

FIG. 1 is a diagram that illustrates an example of a constitution of a semiconductor device according to the first embodiment of the present invention. A semiconductor device 100 includes an RC-IGBT 110, an RC-IGBT 120, a load 130, a microcomputer 140, a control circuit 150, a control circuit 160 and a power potential unit 170. The RC-IGBT 110 includes an IGBT 111 and a diode 112. The RC-IGBT 120 includes an IGBT 121 and a diode 122.

The control circuit 150 includes a voltage detection circuit 151, a gate voltage gradient calculation circuit 152, a current detection circuit 153, a capacitance calculation circuit 154, a capacitance determination circuit 155, an on-off determination circuit 156, a drive circuit 157, and a resistor 158.

The IGBT 111 and the IGBT 121 are connected in series. The diode 112 is disposed corresponding to the IGBT 111. The diode 122 is disposed corresponding to the IGBT 121. The IGBT 111 and the diode 112 are connected in reverse parallel, and the IGBT 121 and the diode 122 are connected in reverse parallel. The diode 122 and the IGBTs 111 and 121 are preferably disposed on the same substrate.

The IGBT 111 and the IGBT 121 are switching elements that perform an on-off operation. Therefore, without particularly restricting to the IGBT, also a power transistor element such as a MOSFET can be used. In the present embodiment, a case where, as an example of the switching element, the IGBT is used will be described. However, when, for example, the MOSFET is used, it is possible to read by replacing a "collector" into a "drain" and an "emitter" into a "source".

The control circuit 160 is disposed between the microcomputer 140 and the RC-IGBT 110. The control circuit 150 is disposed between the microcomputer 140 and the RC-IGBT 120. The load 130 is disposed between the RC-IGBT 110 and the RC-IGBT 120.

In the RC-IGBT 110, an anode of the diode 112 and an emitter of the IGBT 111 are connected, and a cathode of the diode 112 and a collector of the IGBT 111 are connected. The collector is connected with the power potential unit 170, and, for example, a potential VH (high potential) is supplied thereto. A gate of the IGBT 111 is controlled by a drive signal (SinH) 141*a* output from the microcomputer 140 via the control circuit 160 connected to the gate.

In the RC-IGBT 120, an anode of the diode 122 and an emitter of the IGBT 121 are connected, and a cathode of the diode 122 and a collector of the IGBT 121 are connected. The emitter is set to, for example, GND (low potential). A gate of the IGBT 121 is controlled by a drive signal (SinL) 141*b* output from the microcomputer 140 via the control circuit 150 connected to the gate.

The microcomputer 140 outputs a drive signal to a control circuit. For example, the microcomputer 140 inputs the drive signal 141*b* to the control circuit 150 and inputs the drive signal 141*a* to the control circuit 160. Since the drive signal 141*a* and the drive signal 141*b* are phase-reversed signals, the control circuit 150 and the control circuit 160 drive in corresponding ways. As the drive signal, for example, signals that turn on (off) the IGBTs 111 and 121, and signals that turn on (off) the diodes 112 and 122 can be used. As the microcomputer 140, for example, a Micro Controller Unit (MCU), a Micro Processing Unit (MPU), an Electronic Control Unit (ECU), and a Central Processing Unit (CPU) can be used.

The control circuit 150 inputs an appropriate signal to the gate of the IGBT 121 based on the drive signal 141*b* from the microcomputer 140. Thus, an amount of charges injected to the gate of the IGBT is controlled. As will hereinafter be described in detail, the control circuit 150 monitors a gate capacitance of the IGBT 121 at the time of turn-on and estimates, from the gate capacitance, a potential difference (hereinafter, referred to as a collector voltage) generated between the collector and the emitter of the IGBT 121. When the gate capacitance is smaller than a threshold, the collector voltage is determined to be high, and the control circuit 150 turns on the IGBT 121. When the gate capacitance is larger than the threshold, the collector voltage is determined to be low, and the control circuit 150 turns off the IGBT 121.

Hereinafter, the respective constituents contained in the control circuit 150 will be described more specifically.

The voltage detection circuit 151 detects a potential difference (hereinafter referred to as a gate voltage Vge) generated between the gate and the emitter of the IGBT 121 and outputs a detection result to the gate voltage gradient calculation circuit 152. The gate voltage changes based on, for example, an on signal or an off signal output from the microcomputer 140. For example, when the off signal is output from the microcomputer 140, the gate voltage becomes a low level.

The gate voltage gradient calculation circuit (first detection circuit) 152 includes, for example, a change rate calculation unit and calculates a change rate of the gate voltage with respect to time at the change rate calculation unit based on a signal input from the voltage detection circuit 151. Thereafter, a calculation result is output to the capacitance calculation circuit 154. As the change rate calculation unit, for example, a differentiation circuit that differentiates the gate voltage Vge with respect to a time t and outputs a value obtained by differentiating with respect to the time (a derivative dVge/dt) as an output signal can be used. Here, the dVge denotes a change of the gate voltage, and the dt denotes a change of the time.

The current detection circuit (second detection circuit) 153 makes use of the resistor 158, detects a gate current Ig of the IGBT 121, and outputs a detection result to the capacitance calculation circuit 154. Also the gate current changes, in the same manner as the gate voltage, based on, for example, the drive signal output from the microcomputer 140 (it changes also based on the current injected from a current injection circuit in a constitution of Embodiment 2).

The capacitance calculation circuit 154 calculates a gate capacitance Cg based on the signal output from the gate voltage gradient calculation circuit 152 (calculation result of the change rate of the gate voltage with respect to time) and a signal output from the current detection circuit 153 (detection result of the gate current). Thereafter, the calculation result is output to the capacitance determination circuit 155. The gate capacitance is represented by the following formula.

$$\begin{aligned}
&\text{Gate capacitance}\\
&= \text{input capacitance} + \text{feedback capacitance}\\
&= \text{gate current/change rate of gate voltage with respect to time}\\
&= Cies + Cres = Ig/\left\{\frac{dVge}{dt}\right\}\\
&= Cg
\end{aligned}$$

Figure 2:
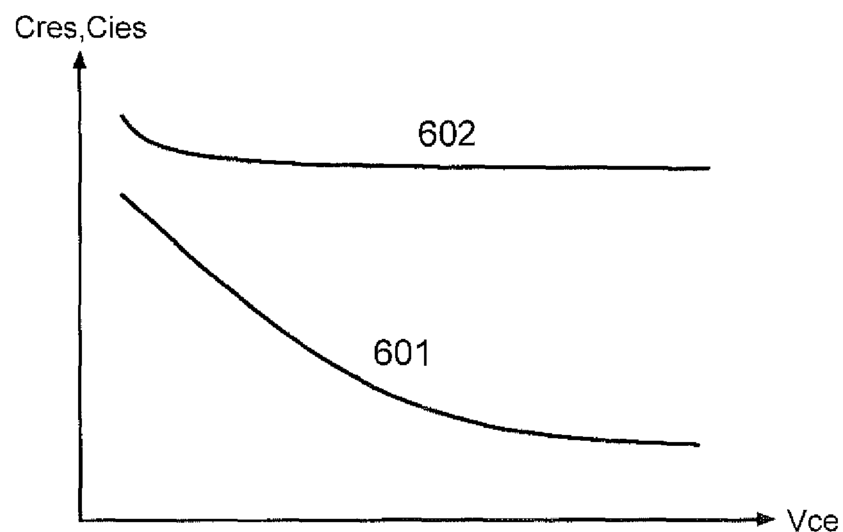
FIG. 2 is a graph that illustrates a relationship between an input capacitance and a feedback capacitance versus a collector voltage.
Figure 3:
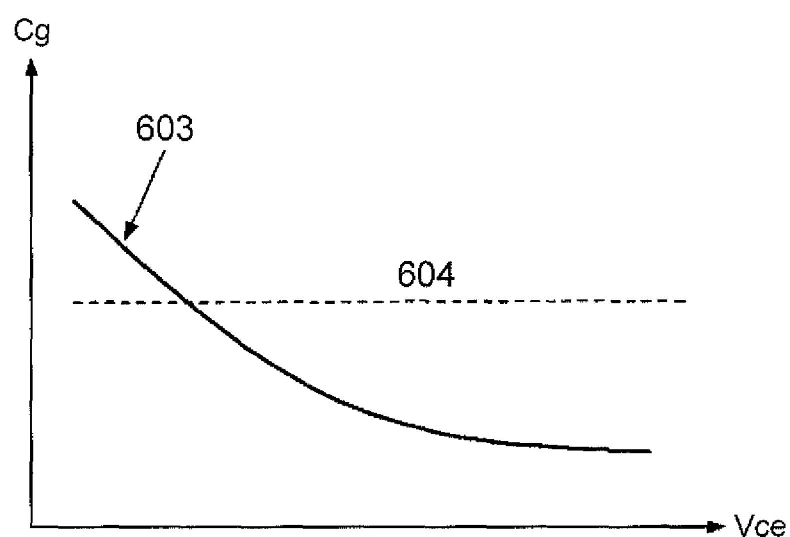
FIG. 3 is a graph that illustrates a relationship between a gate capacitance and a collector voltage.

FIG. 2 shows a relationship between the input capacitance and the feedback capacitance versus the collector voltage. FIG. 3 shows a relationship between the gate capacitance and the collector voltage. As shown in FIG. 2, while a feedback capacitance Cres 601 decreases as the collector voltage becomes higher, an input capacitance Cies 602 does not nearly depend on the collector voltage. Therefore, as shown in FIG. 3, a gate capacitance Cg 603 that is a sum of the input capacitance Cies 602 and the feedback capacitance Cres 601 depends on the collector voltage. Further, as shown in FIG. 3, a rate of decrease when the gate capacitance is a threshold Cth 604 or more is larger than the rate of decrease when the gate capacitance is the threshold Cth 604 or less. That is, the rate of decrease of the gate capacitance accompanying an increase of the collector voltage changes based on the threshold Cth 604.

The feedback capacitance Cres when the collector voltage is high is represented by the following formula.

$$\begin{aligned}
&\text{Feedback capacitance}\\
&= \{(\text{capacitance of insulating film between substrate and gate}) \times\\
&(\text{junction capacitance between substrate and gate})\}/
\end{aligned}$$

-continued $$\begin{aligned}&\{(\text{capacitance of insulating film between substrate and gate})+\\&(\text{junction capacitance between substrate and gate})\}\\&=(Cgd\times Cpn)/(Cgd+Cpn)\\&=Cres\end{aligned}$$

Figure 4:
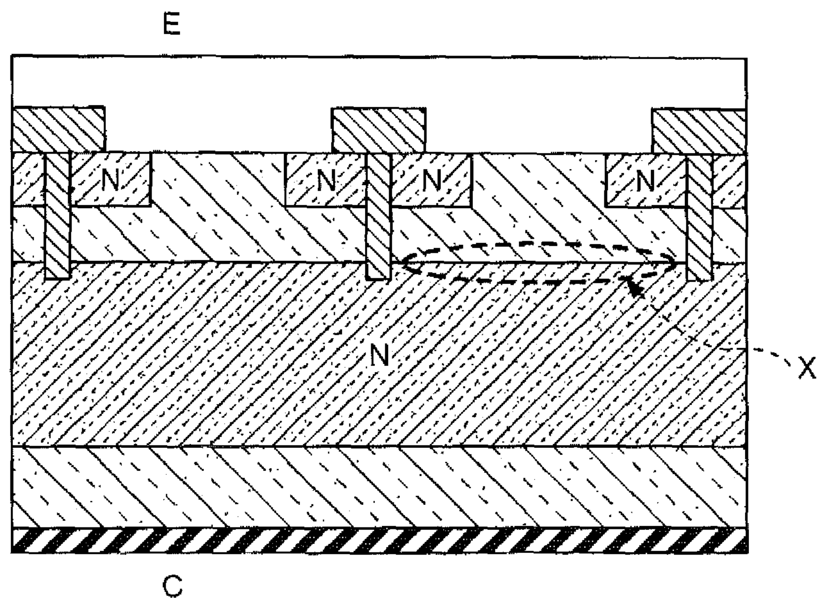
FIG. 4 is a diagram that illustrates a constitution of an IGBT according to the first embodiment.

When the collector voltage is high as shown in FIG. 4, a potential on a collector side becomes high in an N layer of a center of the substrate because a part between a P layer on the collector side and the N layer of the center of the substrate is a forward direction of a PN junction. On the other hand, a reverse bias is applied to a PN junction between a P layer on an emitter side and the N layer of the center of the substrate because the P layer on the emitter side is low in the potential. Therefore, a depleted layer is formed and a junction capacitance Cpn is formed thereby (see X part).

On the other hand, the feedback capacitance Cres when the collector voltage is low is represented by the following formula.

$$\begin{aligned}&\text{Feedback capacitance}\\&=(\text{capacitance of insulating film between substrate and gate})\\&=Cgd\\&=Cres\end{aligned}$$

Figure 5:
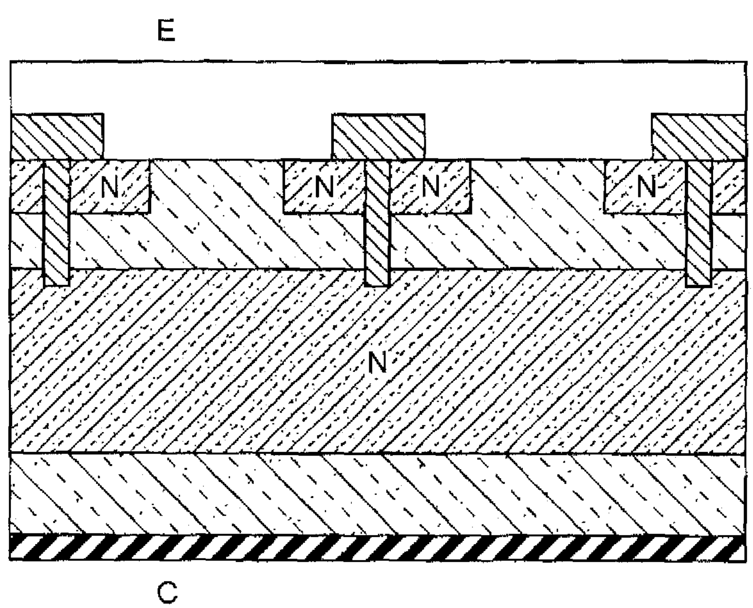
FIG. 5 is a diagram that illustrates the constitution of the IGBT according to the first embodiment.

When the collector voltage is low as shown in FIG. 5, the potential on the collector side becomes low in the N layer of the center of the substrate because the part between the P layer on the collector side and the N layer of the center of the substrate is the forward direction of the PN junction. The reverse bias is not applied to the PN junction between the P layer on the emitter side and the N layer of the center of the substrate because also the P layer on the emitter side is low in the potential. Therefore, the junction capacitance Cpn is not formed because the depleted layer is not formed.

That is, whether the junction capacitance Cpn is formed or not depends on whether the collector voltage is high or low. It can be estimated that the feedback capacitance Cres is small and the collector voltage is high when the junction capacitance Cpn is formed. Further, it can be estimated that the feedback capacitance Cres is large and the collector voltage is low when the junction capacitance Cpn is not formed.

Furthermore, there is the following relationship between the feedback capacitance Cres (Vce: large) when the collector voltage is high and the feedback capacitance Cres (Vce: small) when the collector voltage is low.

$$\text{Feedback capacitance } Cres(Vce\text{: small})>\text{Feedback capacitance } Cres\ (Vce\text{: large})=Cgd>\{(Cgd\times Cpn)/(Cgd+Cpn)\}$$

That is, as the collector voltage becomes higher, the feedback capacitance (Cres) approaches {(Cgd×Cpn)/(Cgd+Cpn)} from Cgd and becomes smaller.

The capacitance determination circuit 155 determines whether the gate capacitance Cg is larger than the threshold Cth or smaller than the threshold Cth based on a signal output from the capacitance calculation circuit 154 and outputs a determination result to the on-off determination circuit 156.

The on-off determination circuit 156 determines whether to turn on the IGBT 121 based on the signal output from the capacitance determination circuit 155 and the drive signal 141*b* output from the microcomputer 140 and outputs a determination result to the drive circuit 157.

For example, when the gate capacitance Cg is smaller than the threshold Cth, the feedback capacitance Cres can be estimated to be large and the collector voltage Vce can be estimated to be high.

In this case, since the IGBT 121 is necessary to be energized, the on-off determination circuit 156 determines to turn on the IGBT 121 (gate on determination). Further, the on-off determination circuit 156 outputs a signal for turning on the IGBT 121 (raising the gate voltage) to the drive circuit 157.

For example, when the gate capacitance Cg is larger than the threshold Cth, the feedback capacitance Cres can be estimated to be small and the collector voltage Vce can be estimated to be low.

In this case, the on-off determination circuit 156 determines to turn off the IGBT 121 (gate-off determination) because the IGBT 121 is not necessary to be energized (the diode 122 is being energized). Further, the on-off determination circuit 156 outputs a signal for turning off the IGBT 121 (decreasing the gate voltage) to the drive circuit 157.

This is estimated based on the gate capacitance after a start of charge injection. Further, the on-off control of the IGBT 121 is performed based on the determination result of the on-off determination circuit 156 obtained by comparing the gate capacitance and the threshold. A time after the start of charge injection includes a monitoring period of the gate capacitance Cg. The monitoring period of the gate capacitance denotes a small period from a time when an on-signal (here, the on-signal is a drive start instruction signal from the microcomputer) is input to the gate of the IGBT 121 to a time when the IGBT 121 is turned on. That is, charges in such an amount that can turn on the IGBT 121 are injected to the gate of the IGBT 121. The on-off determination circuit 156 can determine whether the energization to the IGBT 121 is necessary during a small period when the IGBT 121 is switched from off to on. At an end of the monitoring period of the gate capacitance, the gate voltage does not change. For example, the gate voltage reaches a limiting value.

The drive circuit 157 outputs a control signal to the gate of the IGBT 121 based on the signal output from the on-off determination circuit 156. The IGBT 121 is turned on (or off) based on the control signal.

The control circuit 160 is driven responding to the control circuit 150. Since a constitution of the control circuit 160 is the same as that of the control circuit 150, a detailed description thereof will be omitted. The control circuit 160 outputs a control signal to the gate of the IGBT 111 based on the drive signal 141*a* from the microcomputer 140 in the same manner as in the control circuit 150.

The power potential unit 170 supplies an appropriate potential, for example, VH to the collector of the IGBT 111 and the cathode of the diode 112.

According to the semiconductor device 100 of the present embodiment, the control circuit 150 can determine a polarity of the current based on the gate capacitance after the start of charge injection of the IGBT 121. The polarity of the current can be determined by a method that makes use of the result of the monitoring of the gate capacitance without using a device having a high withstand voltage.

Next, an example of operations at the time of turn-on of the semiconductor device 100 will be described.

Figure 6:
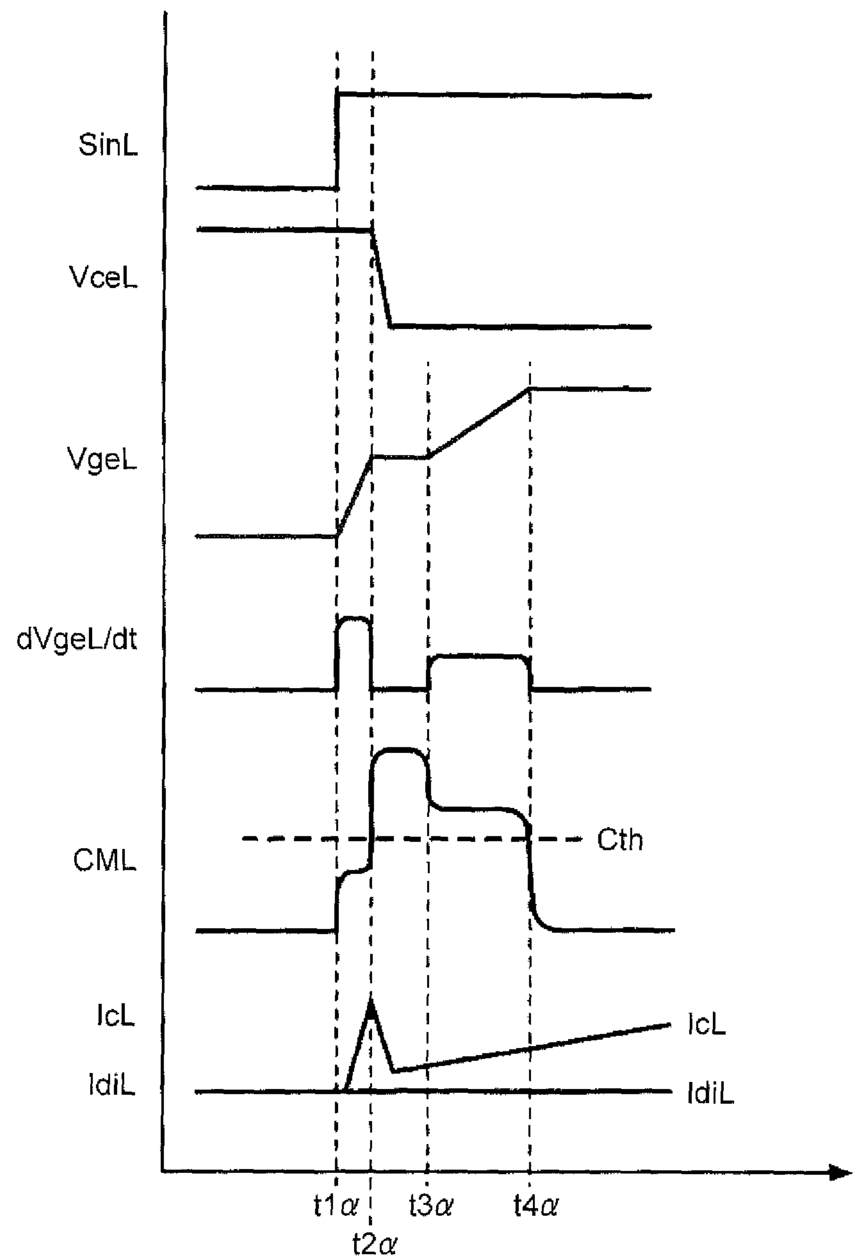
FIG. 6 is a diagram that illustrates an operation of the semiconductor device according to the first embodiment when the IGBT is energized.

Firstly, an operation when the IGBT 121 is energized will be described in detail with reference to FIG. 6. An operation when the on-off determination circuit 156 monitors the gate capacitance at the time of turn-on of the IGBT 121 will be described. A case where a switching waveform in each of the signals becomes "High" is abbreviated as "H", and a case where the switching waveform becomes "Low" is abbreviated as "L".

Until a time t1α is reached, the SinL (drive signal) is "L" because the IGBT 121 is off. The feedback capacitance Cres is small because a VceL (collector voltage) is "H". A VgeL (gate voltage) and a dVgeL/dt (change rate of the gate voltage with respect to time) are "L" because the gate current does not flow. Therefore, also a CML (a monitored value of the gate capacitance Cg) is "L". An IcL (collector current) and an IdiL (diode current) are also "L". Here, the diode 112 in the RC-IGBT 110 is energized and a current flows in the diode 112.

At the time t1α, the SinL changes from "L" to "H". Thus, an on-signal is input to the gate of the IGBT 121 (start to monitor the gate capacitance Cg). The VceL is "H". The gate current flows accompanying the turn-on of the IGBT121. Therefore, the VgeL starts an increase and also the dVgeL/dt starts an increase. Also the CML starts an increase because the monitoring of the gate capacitance Cg is started. The IcL and the IdiL are "L".

The SinL and the VceL maintain "H" from the time t1α to the time t2α (monitoring period of the gate capacitance Cg). The VgeL increases in proportion to the time. The dVgeL/dt increases rapidly in the proximity of the time t2α, passes a maximum value, and decreases rapidly in the proximity of the time t2α. The dVgeL/dt changes such that it has the maximum value at a time in the center between the time t1α and the time t2α (a shape of a waveform becomes a shape like a bisymmetrical parabola). The on-off determination circuit 156 performs the gate on determination of the IGBT121 because the CML does not exceed the threshold Cth. Although the IcL maintains a state of "L" for a while, as the gate capacitance Cg increases, it increases in proportion to the time. The IdiL maintains "L".

At the time t2α, the SinL is "H". The VceL starts a decrease based on the determination result of the on-off determination circuit 156 that the CML is smaller than the threshold Cth (start of a mirror period). The VgeL is a value that increased during from the time t1α to the time t2α. The dVgeL/dt is "L". The CML increases rapidly and becomes larger than the threshold Cth (end of monitoring of the gate capacitance Cg). The IcL is a value that increased during from the time t1α to the time t2α. The IdiL is "L".

During from the time t2α to a time t3α, the SinL maintains "H". The VceL decreases rapidly in proportion to the time and maintains "L". The VgeL becomes flat and maintains a value at the time t2α. The dVgeL/dt maintains "L". The CML maintains a value that increased at the time t2α. The IcL decreases rapidly and, after that, increases gradually in proportion to the time. The IdiL maintains "L".

At the time t3α, the SinL is "H". The VceL is a value that decreased during from the time t2α to the time t3α. The VgeL starts an increase (end of the mirror period) and also the dVgeL/dt starts an increase. The CML starts a decrease. The IcL and the IdiL do not change. Since the VceL is "L" after the end of the mirror period, the feedback capacitance Cres becomes larger, and the on-off determination circuit 156 becomes incapable of determining an energization direction.

Here, the mirror period indicates a period during which due to the change of the collector voltage Vce at the time of turn-on (or at the time of turn-off), the capacitance between the gate and the collector changes and the gate voltage becomes flat. A length of the mirror period depends on, for example, a product of a capacitance between the gate and the collector and a resistance of a resistor 158. Therefore, it is preferable that a loss increase be prevented from increasing by appropriately adjusting the length of the mirror period.

During from the time t3α to a time t4α, the SinL maintains "H". The VceL maintains a value at the time t3α. The VgeL increases in proportion to the time. The dVgeL/dt increases rapidly in the proximity of the time t3α, passes a maximum value, and decreases rapidly in the proximity of the time t4α. The dVgeL/dt changes such that it has the maximum value at a time in the center of the time t3α and the time t4α. Further, the maximum value of the dVgeL/dt during from the time t3α to the time t4α becomes smaller than the maximum value of the dVgeL/dt during from the time t1α to the time t2α. The CML nearly maintains a value that decreased at the time t3α. The IcL continues a gradual increase in proportion to the time. The IdiL maintains "L".

At the time t4α, the SinL is "H", the VceL is a value at the time t3α, and the VgeL is a value that increased during from the time t3α to the time t4α. When the VgeL of the IGBT 121 has completed an increase (has reached a limit value), it maintains a constant value. The gate capacitance Cg cannot be monitored because the gate current does not flow. The dVgeL/dt is "L". The CML decreases rapidly and becomes smaller than the threshold Cth. The IcL and the IdiL do not change.

After the time t4α is exceeded, the SinL maintains "H". The VceL, the VgeL and the dVgeL/dt maintain values at the time t4α. The CML maintains a value that is larger than a value until the time t1α is reached and smaller than a value during from the time t1α to the time t2α. The IcL continues a gradual increase in proportion to the time. The IdiL maintains "L".

Figure 7:
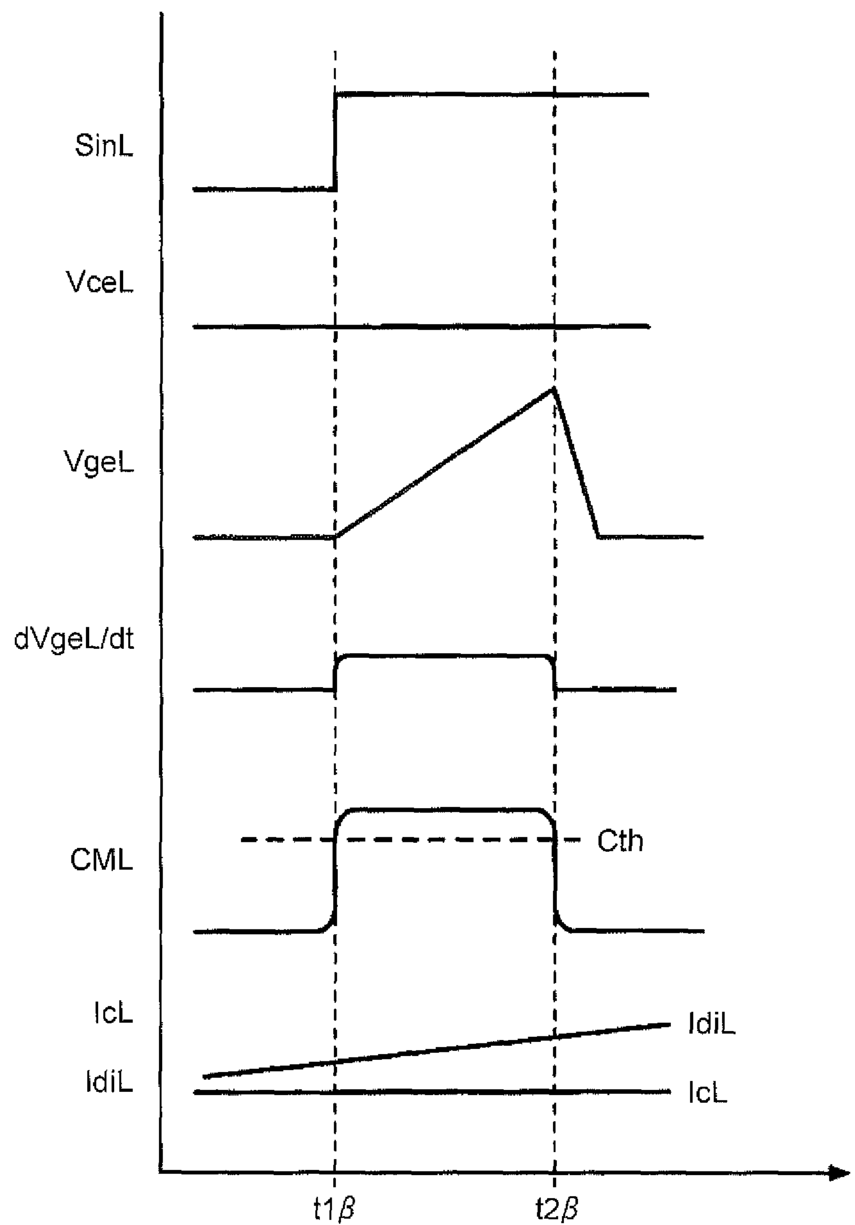
FIG. 7 is a diagram that illustrates the operation of the semiconductor device according to the first embodiment when a diode is energized.

Next, an operation when the diode 122 is energized will be described in detail with reference to FIG. 7. An operation in the case where the on-off determination circuit 156 monitors the gate capacitance at the time of turn-on of the IGBT 121 will be described.

Until a time t1β is reached, the SinL is "L" because the IGBT 121 is off. The feedback capacitance Cres is small because the VceL is "H". The VgeL and the dVgeL/dt are "L" because the gate current does not flow. The CML is "L". The IdiL increases in proportion to the time because the diode 122 is energized. The IcL is "L".

At the time t1β, the SinL changes from "L" to "H". Thus, a signal is input to the gate of the IGBT121 (start of monitoring of the gate capacitance Cg). The VceL is "L". As the IGBT121 is turned on, the gate current flows. Therefore, the VgeL starts an increase and also the dVgeL/dt starts an increase. Also the CML starts an increase because the monitoring of the gate capacitance Cg is started. The behaviors of the IcL and the IdiL do not change.

During from the time t1β to a time t2β (monitoring period of the gate capacitance Cg), the SinL maintains "H" and the VceL maintains "L". The VgeL increases in proportion to the time accompanying turn on of the IGBT 121. The dVgeL/dt increases rapidly in the proximity of the time t1α, passes a maximum value, and decreases rapidly in the proximity of the time t2α. The dVgeL/dt changes such that it has the maximum value at a time in the center of the time t1α and the time t2α. The on-off determination circuit 156 performs the gate off determination of the IGBT 121 based on the monitoring result because the CML exceeds the threshold Cth. The IdiL increases in proportion to the time. The IcL is "L".

At the time t2β, the SinL is "H". The VceL is "L". The VgeL starts a decrease based on the determination result of the on-off determination circuit 156 that the CML is larger than the threshold Cth. The dVgeL/dt is "L". The CML decreases rapidly and becomes smaller than the threshold Cth (end of monitoring of the gate capacitance Cg). The behaviors of the IcL and the IdiL do not change.

After the time t2β is exceeded, the SinL maintains "H" and the VceL maintains "L". The IGBT 121 is turned off because the VgeL decreases rapidly. The gate capacitance Cg cannot be monitored because the gate current does not flow. That is, the on-off determination circuit 156 cannot determine the energization direction. The dVgeL/dt maintains "L". The CML maintains a value at the time t2β. The IdiL increases in proportion to the time. The IcL is "L".

Therefore, according to the semiconductor device 100 of the present embodiment, the gate capacitance Cg is monitored at the time of turn-on of the IGBT 121 and whether it is larger or smaller than the threshold is determined. The control circuit 150 performs an appropriate control by determining whether to turn on the IGBT 121 without any change or to turn off the IGBT 121 by stopping the turn-on of the IGBT 121 based on the determination result of the gate capacitance Cg. Thus, a loss deterioration due to a VF increase of the diode can be suppressed because the diode and the IGBT can be driven by avoiding an interference of the gate.

In the second embodiment, a semiconductor device 200 that is different from the first embodiment will be described. The semiconductor device 200 includes a current injection circuit and an off holding circuit in the control circuit, differing from the semiconductor device 100.

Figure 8:
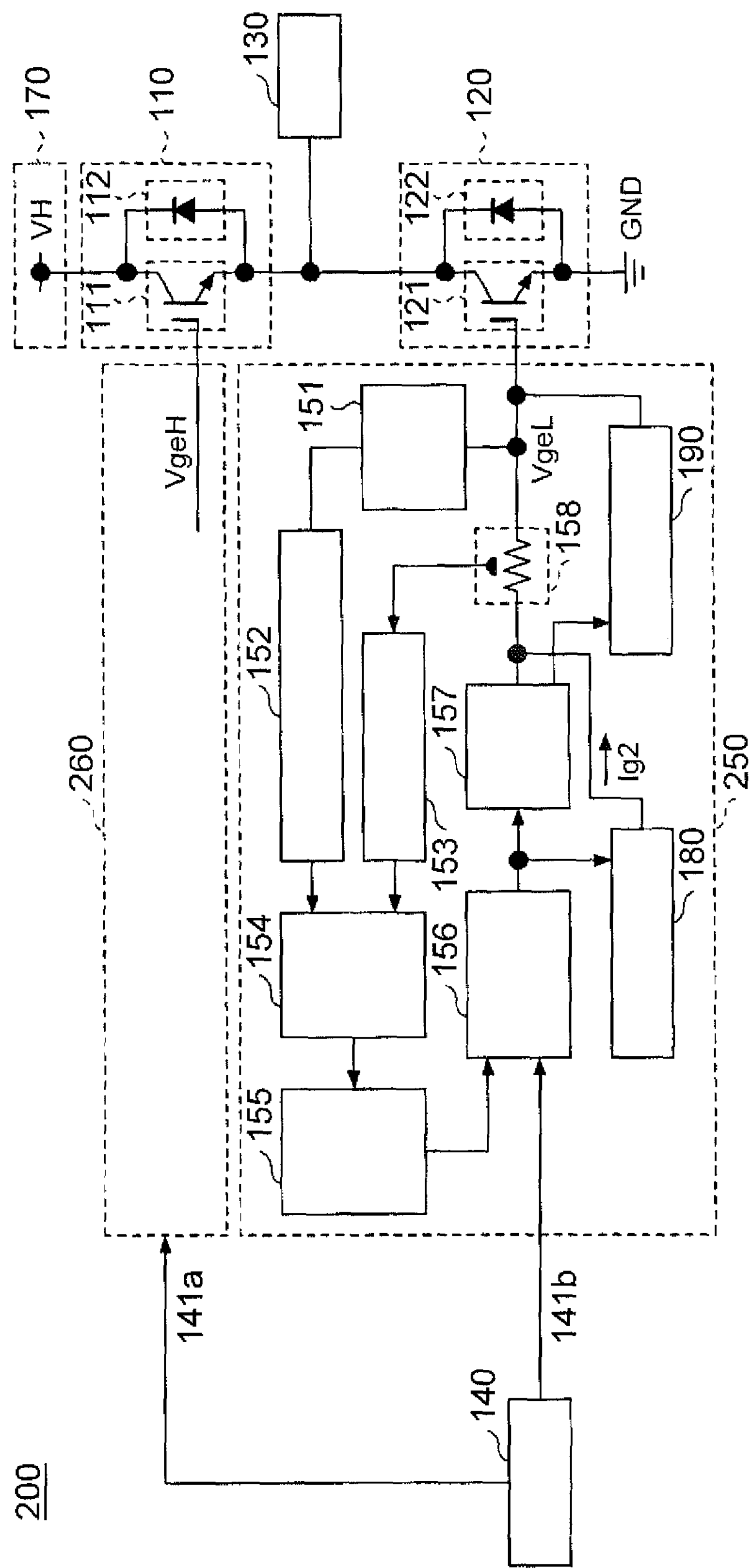
FIG. 8 is a diagram that illustrates a constitution of a semiconductor device according to a second embodiment of the present invention.

FIG. 8 is a diagram that illustrates an example of a constitution of a semiconductor device according to the present embodiment. The semiconductor device 200 includes the RC-IGBT 110, the RC-IGBT 120, the load 130, the microcomputer 140, a control circuit 250, a control circuit 260, and the power potential unit 170. The RC-IGBT 110 includes the IGBT 111 and the diode 112. The RC-IGBT 120 includes the IGBT 121 and the diode 122.

The semiconductor device 200 includes a current injection circuit 180 and an off holding circuit 190 in the control circuit 250 in addition to the constitution of the semiconductor device 100. Further, although also the control circuit 260 includes the current injection circuit and the off holding circuit, since the constitution of the control circuit 260 corresponds to the constitution of the control circuit 250, a detailed description thereof will be omitted.

As shown in FIG. 8, the control circuit 250 includes the voltage detection circuit 151, the gate voltage gradient calculation circuit 152, the current detection circuit 153, the capacitance calculation circuit 154, the capacitance determination circuit 155, the on-off determination circuit 156, the drive circuit 157, the resistor 158, the current injection circuit 180, and the off-holding circuit 190.

The current injection circuit 180 injects a current Ig2 to the gate at the time of turn-off of the IGBT 121. That is, the voltage detection circuit 151 detects a change of the gate voltage that changes based on the current Ig2 that is injected from the current injection circuit 180. Further, in the same manner, the current detection circuit 153 detects a change of the gate current that changes based on the current Ig2 that is injected from the current injection circuit 180. The control circuit 250 controls on-off of the IGBT 121 based on the determination result of the gate capacitance (whether the gate capacitance is larger or smaller than the threshold) at the time of turn-off of the IGBT 121.

The off holding circuit 190 holds the gate voltage of the IGBT 121 such that it may not increase to a predetermined value or more (holds the gate voltage at a predetermined value or less). The gate capacitance can be monitored even at the time of turn-off of the IGBT 121 by holding the gate voltage at the predetermined value or less by the off holding circuit 190.

That is, in the semiconductor device 100 according to the embodiment 1, the control circuit 150 detects the change of the gate capacitance that changes based on an on-signal output from the microcomputer 140. That is, the monitoring period of the gate capacitance is at the time of turn-on of the IGBT 121. On the other hand, in the semiconductor device 200 according to the embodiment 2, the control circuit 250 detects the change of the gate capacitance that changes based on the current Ig2 that is injected from the current injection circuit 180. That is, the monitoring period of the gate capacitance is at the time of turn-off of the IGBT 121.

According to the semiconductor device 200 of the present embodiment, the gate capacitance at the time of turn-off of the IGBT 121 can be monitored by making use of the current injection circuit 180 and the off holding circuit 190. That is, when the diode 122 is energized, it is possible that the IGBT 121 is not utterly turned on. Therefore, superfluous loss can be omitted and the loss deterioration of the diode can be suppressed. Further, the direction of the current (energization direction) can be determined on a real-time basis at the time of turn-off of the IGBT 121.

Next, an example of an operation at the time of turn-off of the semiconductor device 200 will be described.

Firstly, an operation at the time of energization of the IGBT will be described in detail. An operation when the on-off determination circuit 156 monitors the gate capacitance at the time of turn-off of the IGBT will be described.

Figure 9:
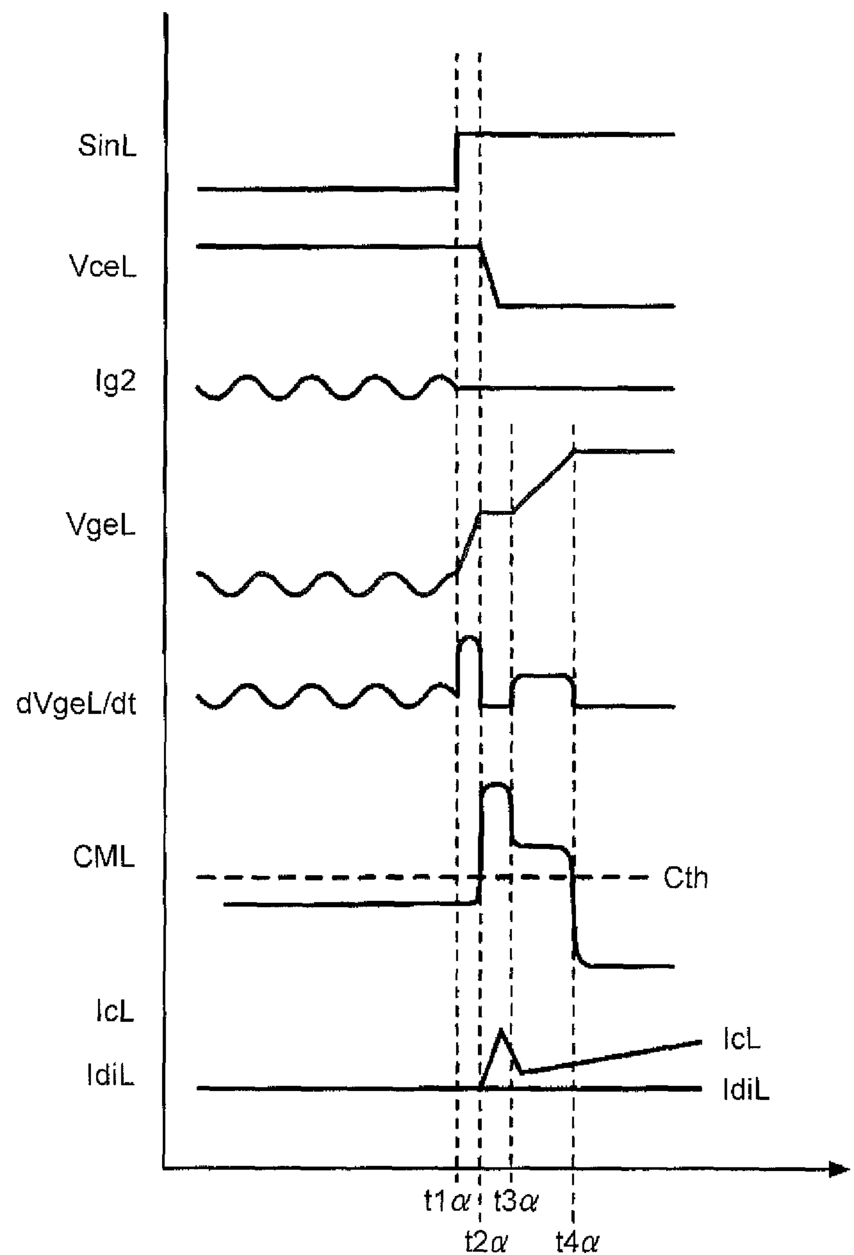
FIG. 9 is a diagram that illustrates the operation of the semiconductor device according to the second embodiment when the IGBT is energized.

In FIG. 9, a switching waveform at the time of turn-on is shown. As shown in FIG. 9, the drive signal is denoted with SinL, the collector voltage is denoted with VceL, the injection current is denoted with Ig2, the gate voltage is denoted with VgeL, the change rate of the gate voltage with respect to time is denoted with dVgeL/dt, the monitoring value of the gate capacitance Cg is denoted with CML, the collector current is denoted with IcL, and the diode current is denoted with IdiL. Further, the case where a switching waveform in each of the signals becomes "High" is abbreviated as "H" and the case where the switching waveform becomes "Low" is abbreviated as "L".

Until the time t1α is reached (monitoring period of the gate capacitance Cg), the SinL is "L" because the IGBT 121 is off. The feedback capacitance Cres is small because the VceL is "H". The Ig2 is a sine curve because the current is injected from the current injection circuit 180 to the gate of the IGBT 121 (start of monitoring of the gate capacitance Cg). The waveform of the current Ig2 is not limited to the sine curve. Also the VgeL and the dVgeL/dt are sine curves because these respond to the Ig2. The CML is smaller than the threshold Cth. Therefore, the on-off determination circuit 156 performs a gate-on determination of the IGBT 121. The IcL and the IdiL are "L".

The SinL changes from "L" to "H" at the time t1α. The VceL is "H". The microcomputer 140 inputs an on-signal to the gate of the IGBT 121 and the IGBT 121 is turned on thereby (end of monitoring of the gate capacitance Cg). The injection of the current to the gate is terminated accompanying the turn-on of the IGBT121 because the current injection circuit 180 injects the current to the gate at only the time of turn-off of the IGBT121. Therefore, the Ig2 changes from the sine curve to "L". The VgeL starts an increase and also the dVgeL/dt starts an increase. The CML and the IcL do not change. The IdiL is "L" because the on-off determination circuit 156 performs the gate-on determination of the IGBT 121 (the diode 122 is off).

During from the time t1α to the time t2α, the SinL and the VceL maintain "H". The Ig2 maintains "L". The VgeL increases in proportion to the time accompanying the turn-on of the IGBT 121. The dVgeL/dt increases rapidly in the proximity of the time t1α, passes a maximum value, and decreases rapidly in the proximity of the time t2α. The dVgeL/dt changes such that it has the maximum value at a time in the center of the time t1α and the time t2α. The CML, the IcL and the IdiL do not change.

At the time t2α, the SinL is "H". The VceL starts a decrease based on the determination result of the on-off determination circuit 156 that the CML is smaller than the threshold Cth (start of a mirror period). The Ig2 does not change. The VgeL is a value that increased during from the time t1α to the time t2α. The dVgeL/dt decreases rapidly and is "L". The CML increases rapidly and becomes larger than the threshold Cth. The IcL starts an increase. The IdiL is "L".

During from the time t2α to the time t3α, the SinL maintains "H". The VceL decreases rapidly in proportion to the time and maintains "L". The Ig2 maintains "L". The VgeL becomes flat and maintains a value at the time t2α. The dVgeL/dt maintains "L". The CML maintains a value that increased at the time t2α. The IcL increases in proportion to the time and, after that, decreases in proportion to the time. The IdiL maintains "L".

At the time t3α, the SinL is "H". The VceL is a value that decreased during from the time t2α to the time t3α. The Ig2 does not change. The VgeL starts an increase (end of the mirror period) and also the dVgeL/dt starts an increase. The CML decreases rapidly but is larger than the threshold Cth. The IcL is in the middle of the decrease and IdiL does not change. The gate capacitance Cg cannot be monitored after the end of the mirror period.

During from the time t3α to the time t4α, the SinL maintains "H". The VceL maintains a value at the time t3α. The Ig2 maintains "L". The VgeL increases in proportion to the time. The dVgeL/dt increases rapidly in the proximity of the time t3α, passes a maximum value, and decreases rapidly in the proximity of the time t4α. The dVgeL/dt changes such that it has the maximum value at a time in the center of the time t3α and the time t4α. Further, the maximum value of the dVgeL/dt during from the time t3α to the time t4α becomes smaller compared with the maximum value of the dVgeL/dt during from the time t1α to the time t2α. The CML maintains nearly a value that decreased at the time t3α. The IcL decreases in proportion to the time and, after that, increases in proportion to the time. The IdiL maintains "L".

At the time t4α, the SinL is "H" and the VceL is the value at the time t3α. The Ig2 does not change. The VgeL is a value that increased during from the time t3α to the time t4α. When the VgeL of the IGBT 121 completes an increase (upon reaching a limit value), it maintains a constant value. The gate capacitance Cg cannot be monitored because the gate current does not flow. The dVgeL/dt is "L". The CML decreases rapidly and becomes smaller than the threshold Cth. The behaviors of the IcL and the IdiL do not change.

After the time t4α is exceeded, the SinL maintains "H". The VceL, the Ig2, the VgeL, and the dVgeL/dt maintain values at the time t4α. The CML maintains a value that is smaller than a value until the time t1α is reached. The IcL continues a gradual increase in proportion to the time. The IdiL maintains "L".

Next, an operation at the time of energization of the diode 122 will be described in detail. An operation in the case where the on-off determination circuit 156 monitors the gate capacitance at the time of turn-off of the IGBT will be described.

Figure 10:
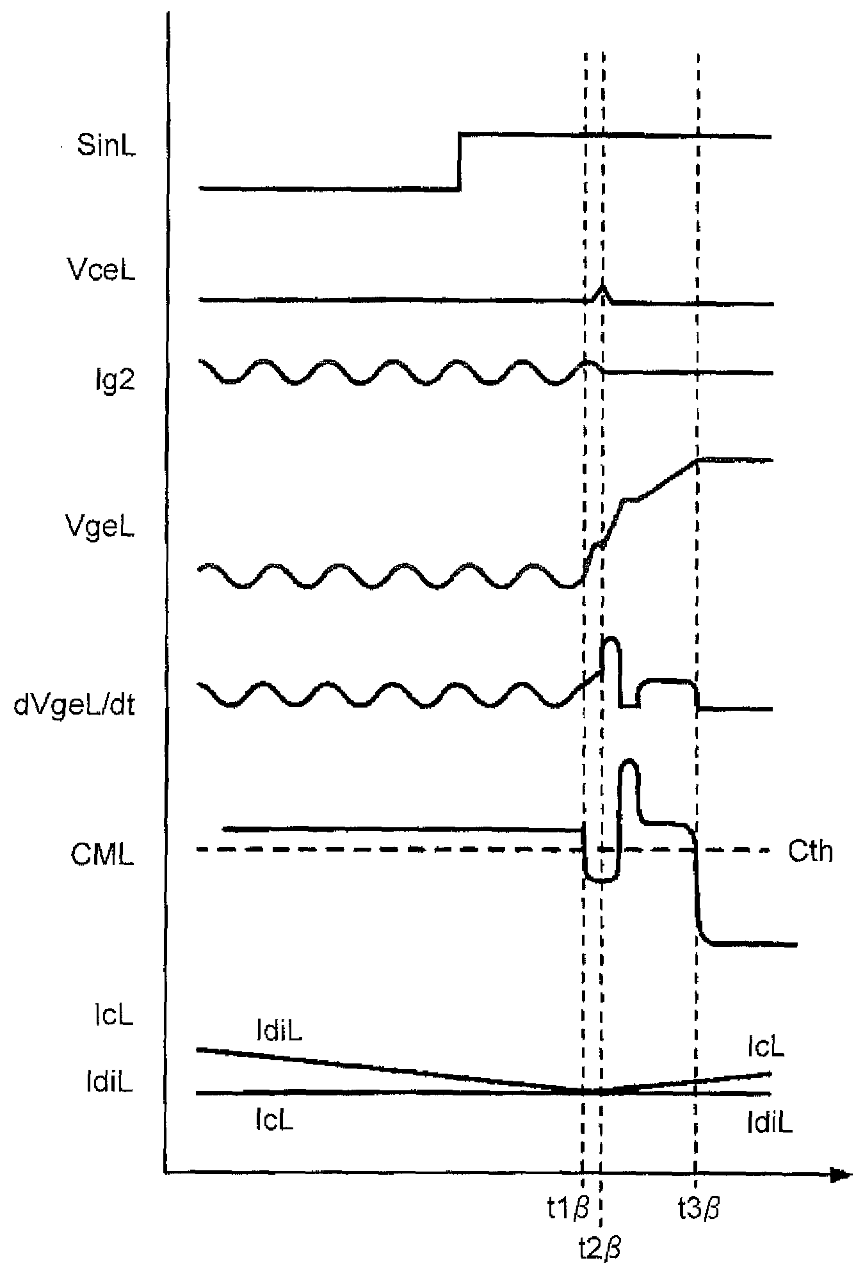
FIG. 10 is a diagram that illustrates the operation of the semiconductor device according to the second embodiment when the diode is energized.

In FIG. 10, a switching waveform at the time of turn-on is shown. As shown in FIG. 10, the drive signal is denoted with SinL, the collector voltage is denoted with VceL, the injection current is denoted with Ig2, the gate voltage is denoted with VgeL, the change rate of the gate voltage with respect to time is denoted with dVgeL/dt, the monitoring value of the gate capacitance Cg is denoted with CML, the collector current is denoted with IcL, and the diode current is denoted with IdiL.

Until the time t1β is reached, the IGBT 121 is off. The SinL changes from "L" to "H" on the way. The feedback capacitance Cres is small because the VceL is "H". The Ig2 is a sine curve because the current is injected from the current injection circuit 180 to the gate of the IGBT 121 (start of monitoring of the gate capacitance Cg). Also the VgeL and the dVgeL/dt are sine curves because these respond to the Ig2. The CML is larger than the threshold Cth. Therefore, the on-off determination circuit 156 performs a gate-off determination of the IGBT 121. Although the diode 122 is energized, the IdiL decreases gradually in proportion to the time. The IcL is "L".

The SinL is "H" at the time t1β. The VceL is "L". The Ig2 is the sine curve. The VgeL starts an increase because charges based on the on-signal from the microcomputer 140 are injected to the gate of the IGBT 121. Also the dVgeL/dt starts an increase. The CML decreases rapidly. The IdiL and the IcL do not change.

During from the time t1β to the time t2β, the SinL maintains "H". The VceL maintains "L" for a while and, after that, increases. The Ig2 is the sine curve. The VgeL increases in proportion to the time accompanying the turn-on of the IGBT 121. Also the dVgeL/dt increases accompanying the increase of the VgeL. The CML maintains a value that decreased at the time t1β. The CML is smaller than the threshold Cth. The IdiL is "L" (the diode 122 is off) because the on-off determination circuit 156 performs the gate-on determination of the IGBT 121. Here, a current direction is reversed. As the current direction is reversed, the IcL increases gradually from "L" in proportion to the time.

At the time t2β, the SinL is "H". The VceL passes a peak of an increase and starts a decrease. The current injection circuit 180 injects the current to the gate only the time of turn-off of the IGBT121. Therefore, the injection of the current to the gate is terminated accompanying the turn-on of the IGBT 121. Thus, the Ig2 changes to "L" from the sine curve (end of monitoring of the gate capacitance Cg). The VgeL starts an increase and also the dVgeL/dt starts an increase. The CML is smaller than the threshold Cth. The IcL and the IdiL do not change.

During from the time t2β to the time t3β, the SinL maintains "H". The VceL decreases rapidly in proportion to the time and maintains "L". After the end of the mirror period, the feedback capacitance Cres becomes larger because the VceL is "L", and the on-off determination circuit 156 cannot monitor the gate capacitance Cg. The Ig2 maintains "L". The VgeL increases in proportion to the time, becomes flat at a certain value, and increases again in proportion to the time. The dVgeL/dt increases rapidly in the proximity of the time t2β, passes a maximum value, decreases rapidly ("L"), after that, increases again, passes a maximum value, and decreases ("L"). Here, the maximum value of the dVgeL/dt in the second increase becomes smaller compared with the maximum value of the dVgeL/dt in the first increase. The CML increases rapidly, becomes larger than the threshold Cth, after that, decreases rapidly and maintains a value larger than the threshold Cth. The IcL increases gradually in proportion to the time. The IdiL maintains "L".

At the time t3β, the SinL is "H". The VceL and the Ig2 are "L". The VgeL is a value at the time t3β. The dVgeL/dt is "L". The CML decreases rapidly (smaller than the threshold Cth). The behaviors of the IcL and the IdiL do not change.

After the time t3β is exceeded, the SinL maintains "H" and the VceL and the Ig2 maintain "L". The VgeL maintains a value at the time t3β. When the VgeL of the IGBT 121 completes an increase (reaches a limiting value), it maintains a constant value. The gate capacitance Cg cannot be monitored because the gate current does not flow. The dVgeL/dt maintains "L". The CML maintains a value at the time t3β. The IcL increases gradually in proportion to the time. The IdiL does not change.

Therefore, according to the semiconductor device 200 of the present embodiment, a technology that can determine a polarity of the current without using a device having a high withstand voltage can be provided.

In the above, although embodiments for carrying out the present invention have been described in detail, the present invention is not limited to such specific embodiments. The present invention can be variously modified and altered within a range of a gist of the present invention.

What is claimed is:

1. A semiconductor device comprising:
- a transistor;
- a diode connected in reverse parallel with the transistor;
- a first detection circuit configured to detect a change rate of a gate voltage of the transistor with respect to time;
- a second detection circuit configured to detect a gate current of the transistor;
- a calculation circuit configured to calculate a gate capacitance based on the change rate of the gate voltage with respect to time, and the gate current; and
- a determination circuit configured to determine, based on a determination result of the gate capacitance at a time when a charge is injected to a gate of the transistor, whether a current flows to the diode or to the transistor.

2. The semiconductor device according to claim 1, wherein
- on-off of the transistor is controlled based on the determination result of the gate capacitance at a time when the transistor is off.

3. The semiconductor device according to claim 1, further comprising
- an on-off determination circuit configured to determine whether to turn on the transistor based on the determination result of the gate capacitance at a time when the transistor is off.

4. The semiconductor device according to claim 3, wherein
- the first detection circuit, the second detection circuit, the calculation circuit, the determination circuit, and the on-off determination circuit constitute a part of a control circuit; and
- the control circuit is configured to control on-off of the transistor.

5. The semiconductor device according to claim 4, wherein
- the control circuit includes a drive circuit; and
- the drive circuit is configured to control the on-off of the transistor based on a signal output from the on-off determination circuit.

6. The semiconductor device according to claim 1, further comprising:
- a current injection circuit configured to inject a charge to the gate at a time when the transistor is off; and
- an off holding circuit configured to hold the gate voltage at a predetermined value or less at the time when the transistor is off.

7. A control method of a semiconductor device that includes a transistor and a diode that is connected in reverse parallel with the transistor, the control method comprising:
- detecting a change rate of a gate voltage of the transistor with respect to time;
- detecting a gate current of the transistor;
- calculating a gate capacitance based on the change rate of the gate voltage with respect to time, and the gate current; and
- determining, based on a determination result of the gate capacitance when a charge is injected to a gate of the transistor, whether a current flows to the diode or to the transistor.

* * * * *